(12) United States Patent
Guterman

(10) Patent No.: US 7,821,835 B2
(45) Date of Patent: *Oct. 26, 2010

(54) CONCURRENT PROGRAMMING OF NON-VOLATILE MEMORY

(75) Inventor: Daniel C. Guterman, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 201 days.

This patent is subject to a terminal disclaimer.

(21) Appl. No.: 11/936,081

(22) Filed: Nov. 7, 2007

(65) Prior Publication Data

US 2008/0055994 A1 Mar. 6, 2008

Related U.S. Application Data

(62) Division of application No. 10/868,147, filed on Jun. 15, 2004, now Pat. No. 7,307,884.

(51) Int. Cl.
*G11C 11/34* (2006.01)
(52) U.S. Cl. .............. 365/185.18; 365/185.17; 365/185.2
(58) Field of Classification Search ............ 365/185.18, 365/185.17, 185.2, 185.28, 185.25, 203, 365/185.29, 185.03
See application file for complete search history.

(56) References Cited

U.S. PATENT DOCUMENTS

| | | | |
|---|---|---|---|
| 5,712,815 A | 1/1998 | Bill et al. |
| 5,841,696 A | 11/1998 | Chen et al. |
| 5,847,998 A | 12/1998 | Van Buskirk |
| 5,894,437 A | 4/1999 | Pellegrini |
| 5,978,267 A | 11/1999 | Chen et al. |
| 6,064,611 A | 5/2000 | Tanaka et al. |
| 6,091,633 A | 7/2000 | Cernea et al. |
| 6,107,659 A | 8/2000 | Onakado et al. |

(Continued)

FOREIGN PATENT DOCUMENTS

JP       10134588 A       5/1998

(Continued)

OTHER PUBLICATIONS

Chinese Office Action dated Jan. 9, 2009 in Chinese Patent Application No. 200580019388.9.

(Continued)

*Primary Examiner*—Dang T Nguyen
(74) *Attorney, Agent, or Firm*—Vierra Magen Marcus & DeNiro LLP

(57) ABSTRACT

One embodiment of the present invention includes applying a first value to a bit line, boosting word lines associated with the bit line and a common selection line to create a first condition based on the first value, and cutting off a boundary non-volatile storage element associated with the common selection line to maintain the first condition for a particular non-volatile storage element associated with the bit line and common selection line. A second value is applied to the bit line and at least a subset of the word lines are boosted to create a second condition for a different non-volatile storage element associated with the bit line and common selection line. The second condition is based on the second value. The first condition and the second condition overlap in time. Both non-volatile storage elements are programmed concurrently, based on their associated conditions.

13 Claims, 9 Drawing Sheets

U.S. PATENT DOCUMENTS

| | | | |
|---|---|---|---|
| 6,122,193 | A | 9/2000 | Shibata et al. |
| 6,141,253 | A | 10/2000 | Lin |
| 6,259,624 | B1 | 7/2001 | Nobukata |
| 6,282,117 | B1 | 8/2001 | Tanaka |
| 6,307,785 | B1 | 10/2001 | Takeuchi |
| 6,424,566 | B1 | 7/2002 | Parker |
| 6,522,585 | B2 | 2/2003 | Pasternak |
| 6,525,964 | B2 | 2/2003 | Tanaka et al. |
| 6,529,409 | B1 | 3/2003 | Nguyen et al. |
| 6,529,410 | B1 | 3/2003 | Han et al. |
| 6,532,172 | B2 | 3/2003 | Harari et al. |
| 6,731,544 | B2 | 5/2004 | Han et al. |
| 6,813,187 | B2 | 11/2004 | Lee |
| 6,845,039 | B2 | 1/2005 | Chen et al. |
| 6,859,397 | B2 | 2/2005 | Lutze et al. |
| 7,023,739 | B2 | 4/2006 | Chen et al. |
| 7,031,192 | B1 | 4/2006 | Park et al. |
| 7,110,300 | B2 | 9/2006 | Visconti |
| 7,154,779 | B2 * | 12/2006 | Mokhlesi et al. ....... 365/185.01 |
| 7,177,196 | B2 | 2/2007 | Takeuchi et al. |
| 7,177,197 | B2 | 2/2007 | Cernea |
| 7,307,884 | B2 | 12/2007 | Guterman |
| 7,525,843 | B2 * | 4/2009 | Sekar et al. ............ 365/185.18 |
| 2002/0071312 | A1 | 6/2002 | Tanaka |
| 2002/0118569 | A1 | 8/2002 | Jeong et al. |
| 2004/0032788 | A1 | 2/2004 | Sakui |
| 2005/0015539 | A1 | 1/2005 | Horii et al. |
| 2005/0083735 | A1 | 4/2005 | Chen et al. |
| 2007/0195598 | A1 | 8/2007 | Park et al. |
| 2007/0291542 | A1 | 12/2007 | Aritome |
| 2008/0123426 | A1 * | 5/2008 | Lutze et al. ............ 365/185.17 |
| 2008/0298129 | A1 | 12/2008 | Tanaka et al. |

FOREIGN PATENT DOCUMENTS

| | | | |
|---|---|---|---|
| JP | 10283788 | A | 10/1998 |
| JP | 11031392 | A | 2/1999 |
| JP | 2000149577 | A | 5/2000 |
| JP | 2000149578 | A | 5/2000 |
| JP | 2003196988 | A | 7/2003 |
| TW | 394951 | B | 6/2000 |
| TW | 556194 | B | 10/2003 |
| WO | 9808225 | | 2/1998 |

OTHER PUBLICATIONS

Chinese Office Action dated Jan. 9, 2009 in Chinese Patent Application No. 200580019389.3.
Chinese Office Action dated Feb. 6, 2009 in Chinese Application No. 200580025143.7.
Office Action dated Mar. 10, 2009 in U.S. Appl. No. 11/936,086.
International Search Report and Written Opinion of the International Searching Authority dated Nov. 16, 2005 in PCT Application No. PCT/US2005/019393.
Taiwanese Office Sction, Preliminary Notice of Rejection of the IPO, dated Oct. 4, 2006 in Taiwanese Patent Application No. 094119311.
Notice of Allowance and Fee(s) Due dated Apr. 1, 2009 in U.S. Appl. No. 11/936,084.
European Office Action dated Apr. 14, 2009 in European Patent Application No. 05755315.8.
Office Action and Search Report dated Mar. 2008, Taiwan Patent Application No. 094114591.
Notice of Allowance dated Apr. 7, 2008, U.S. Appl. No. 11/945,203.
Office Action dated Apr. 29, 2008, Korean Patent Application No. 7001028/2007.
Response to Office Action filed Jun. 10, 2009 in U.S. Appl. No. 11/936,086.
Preliminary Amendment dated Nov. 30, 2007, U.S. Appl. No. 11/936,086, filed Nov. 7, 2007.
Preliminary Amendment dated Nov. 30, 2007, U.S Appl. 11/936,084, filed Nov. 7, 2007.
International Search Report dated Nov. 16, 2005 in PCT Application No. PCT/US2005/019393.
European Office Action dated Aug. 20, 2008 in European Patent Application No. 05736981.1.
Office Action dated Jan. 30, 2008, Korean Patent Application No. 7025632/2006.
Office Action dated Sep. 22, 2009, U.S. Appl. No. 11/936,086.
Chinese Office Action dated Sep. 4, 2009, Chinese Application No. 200580025143.7.
Response to European Office Action filed Oct. 23, 2009 in European Patent Application No. 05755315.8.
Japanese Notice of Reasons for Rejection (non-final office action) mailed Dec. 1, 2009 in Japanese Patent Application No. 2007-511393.
Japanese Notice of Reasons for Rejection (non-final office action) mailed Dec. 1, 2009 in Japanese Patent Application No. 2007-516526.
Japanese Notice of Reasons for Rejection (non-final office action) mailed Dec. 1, 2009 in Japanese Patent Application No. 2007-511394.
Response to Office Action filed Dec. 18, 2009 in U.S. Appl. No. 11/936,086.
Notice of Allowance and Fee(s) Due dated Apr. 30, 2010 in U.S. Appl. No. 11/936,086.
Response to Office Action filed Feb. 19, 2010 in Japanese Patent Application No. 2007-516526.
English Translation of Claims as Amended in Reponse to Office Action filed Feb. 19, 2010 in Japanese Patent Application No. 2007-516526.

* cited by examiner

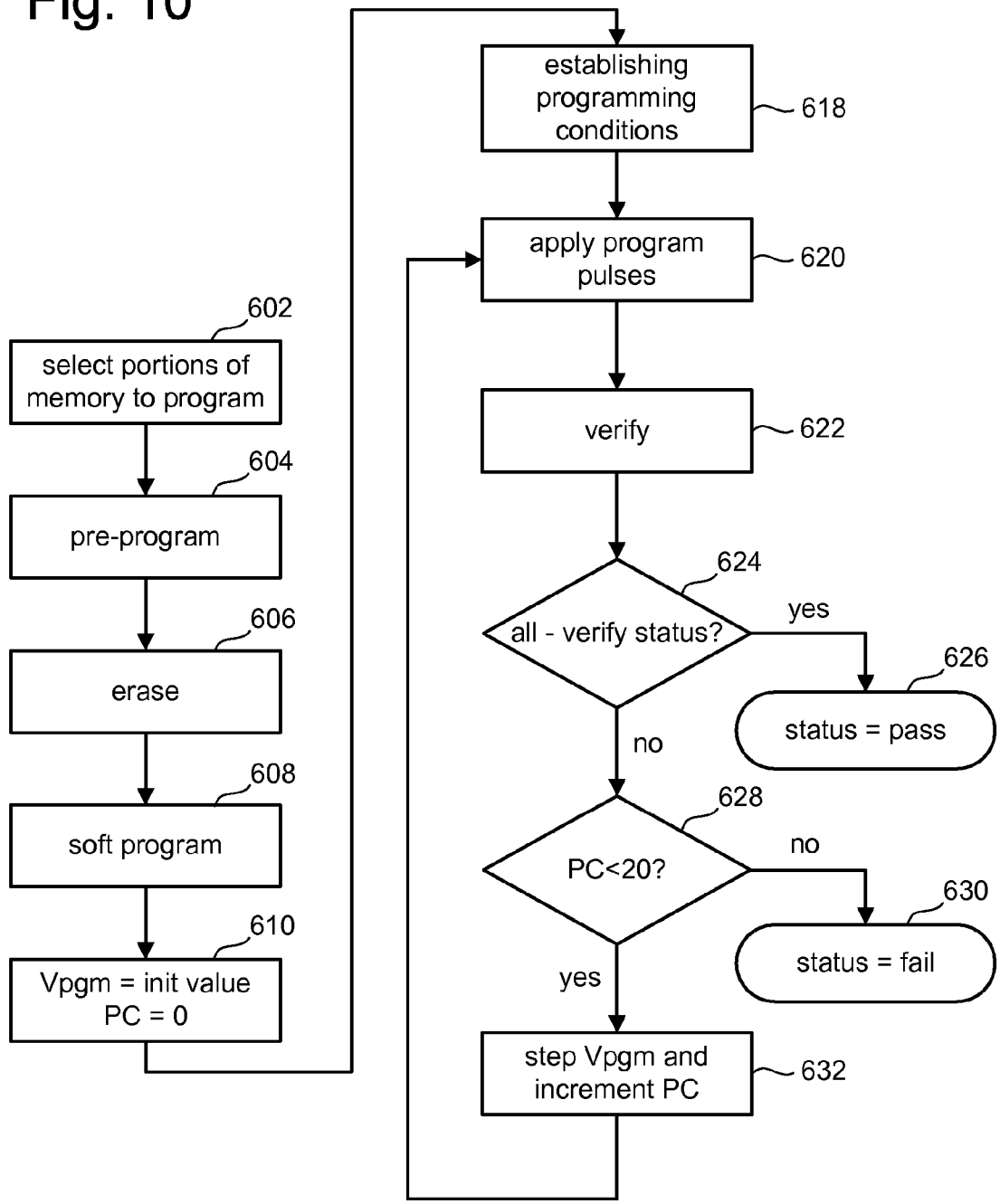

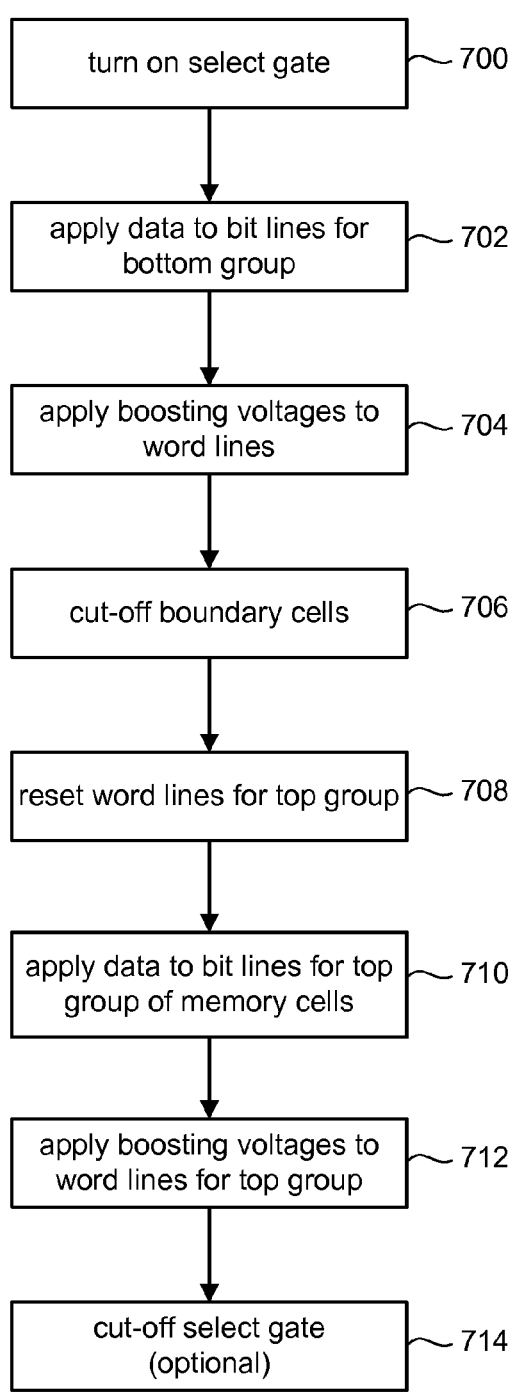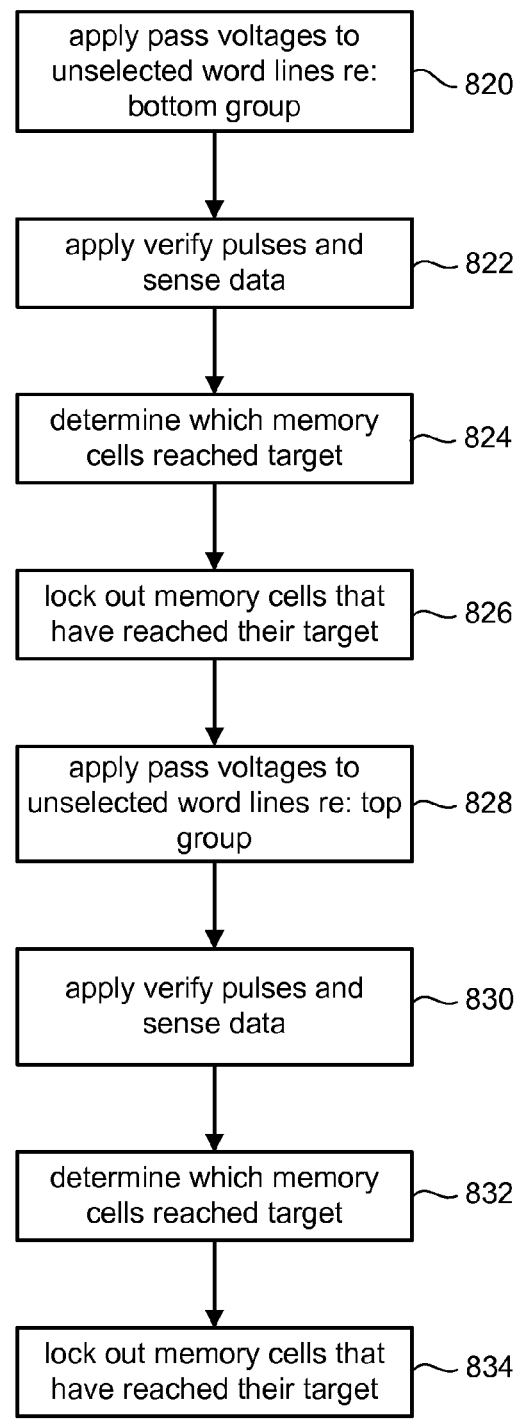

CONCURRENT PROGRAMMING OF NON-VOLATILE MEMORY

CLAIM OF PRIORITY

This application is a divisional application of U.S. patent application Ser. No. 10/868,147, "CONCURRENT PROGRAMMING OF NON-VOLATILE MEMORY," filed on Jun. 15, 2004, by Daniel C. Guterman, published on Dec. 15, 2005 as U.S. Publication No. 2005-0276108A1, incorporated herein by reference.

CROSS-REFERENCE TO RELATED APPLICATIONS

This Application is related to the following United States patent applications, all of which are incorporated herein by reference in their entirety:

U.S. Pat. No. 7,023,733, issued Apr. 4, 2006, "Boosting To Control Programming Of Non-Volatile Memory," application Ser. No. 10/839,764, filed on May 5, 2004, by Guterman;

U.S. Pat. No. 7,020,026, issued Mar. 28, 2006, "Bitline Governed Approach For Program Control of Non-Volatile Memory," application Ser. No. 10/839,806, filed on May 5, 2004, by Guterman; and U.S. Pat. No. 7,177,197, issued Feb. 13, 2007, "Latched Programming Of Memory And Method," application Ser. No. 10/842,941, filed May 10, 2004, Inventor Raul-Adrian Cernea.

BACKGROUND OF THE INVENTION

1. Field of the Invention

The present invention relates to technology for programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory cell can be programmed/erased between two states (an erased state and a programmed state). When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

A multi-state flash memory cell is implemented by identifying multiple, distinct allowed programmed threshold voltage ranges separated by forbidden voltage ranges. Each distinct threshold voltage range corresponds to a predetermined value for the set of data bits.

Typically, the program voltage applied to the control gate is applied as a series of pulses. The magnitude of the pulses is increased with each successive pulse by a predetermined step size (e.g. 0.2v, 0.4v, or other). In the periods between the pulses, verify operations are carried out. As the number of programmable states increase, the number of verify operations increases and more time is needed. One means for reducing the time burden of verifying is to use a more efficient verify process, such as the process that is disclosed in U.S. patent application Ser. No. 10/314,055, "Smart Verify for Multi-State Memories," filed Dec. 5, 2002, incorporated herein by reference in its entirety. However, there is a consumer demand for memory devices that program as fast as possible. For example, a user of a digital camera that stores images on a flash memory card does not want to wait between pictures.

Therefore, there is further need to reduce the amount of time needed to program non-volatile memory.

SUMMARY OF THE INVENTION

The present invention, roughly described, pertains to technology for reducing the time needed to program non-volatile memory.

One embodiment of the present invention includes programming a first non-volatile storage element of a group of non-volatile storage elements and programming a second non-volatile storage element of the group of non-volatile storage elements. The programming of the first non-volatile storage element overlaps in time with the programming of the second non-volatile storage element. In one example implementation, the first non-volatile storage element and the second non-volatile storage element are NAND flash memory elements on the same NAND string.

Some embodiments of the present invention include establishing a first program condition for a first non-volatile storage element and establishing a second program condition for a second non-volatile storage element while the first program condition persists. The first program condition can be different than the second program condition. The first non-volatile storage element and the second non-volatile storage element are part of a group of non-volatile storage elements associated with a common source/drain control line. The first non-volatile storage element is programmed using the first program condition and the second non-volatile storage element is programmed using said second program condition.

One example implementation includes applying a first value to a bit line, boosting word lines associated with the bit line to create a first condition based on the first value and cutting off a boundary non-volatile storage element associated with the bit line to maintain the first condition for a particular non-volatile storage element associated with the bit line. A second value is applied to the bit line and at least a subset of the word lines associated with the bit line are boosted to create a second condition for a different non-volatile storage element. The first condition and the second condition exist during overlapping times. Both non-volatile storage elements are programmed based on the associated conditions.

Various embodiments of the present invention include programming one or more non-volatile storage elements. For example, the present invention can be used to program an array of flash memory devices (or other types of non-volatile storage elements). One embodiment utilizes NAND flash memory. In some example implementations, the programming of the one or more non-volatile storage elements is performed by or at the direction of a control circuit. The components of the control circuit may differ based on the particular application. For example, a control circuit may include any one of the following components or any combination of two or more of the following components: controller, command circuits, state machine, row control, column control, source control, p-well or n-well control, or other circuits that perform similar functionality.

These and other objects and advantages of the present invention will appear more clearly from the following description in which the preferred embodiment of the invention has been set forth in conjunction with the drawings.

BRIEF DESCRIPTION OF THE DRAWINGS

FIG. 10 is a flow chart describing one embodiment of a process for programming flash memory.

FIG. 11 is a flow chart describing one embodiment of a process for establishing program conditions.

FIG. 14 is a flow chart describing one embodiment of a process for verifying.

DETAILED DESCRIPTION

The invention is illustrated by way of example, and not by way of limitation, in the figures of the accompanying drawings in which like references indicate similar elements. It should be noted that references to an or one embodiment in this disclosure are not necessarily the same embodiment, and such references mean at least one.

In the following description, various aspects of the present invention will be described. However, it will be apparent to those skilled in the art that the present invention may be practiced with only some or all of the aspects of the present disclosure. For purposes of explanation, specific numbers, materials and configurations are set forth in order to provide a thorough understanding of the invention. However, it will be apparent to one skilled in the art that the present invention may be practiced without all of the specific details. In other instances, well known features are omitted or simplified in order not to obscure the present invention.

Various embodiments will be described as multiple discreet steps in turn, in a manner that is most helpful in understanding the present invention. However, the order of this description should not be construed as to imply that these operations are necessarily order dependent.

Figure 1:
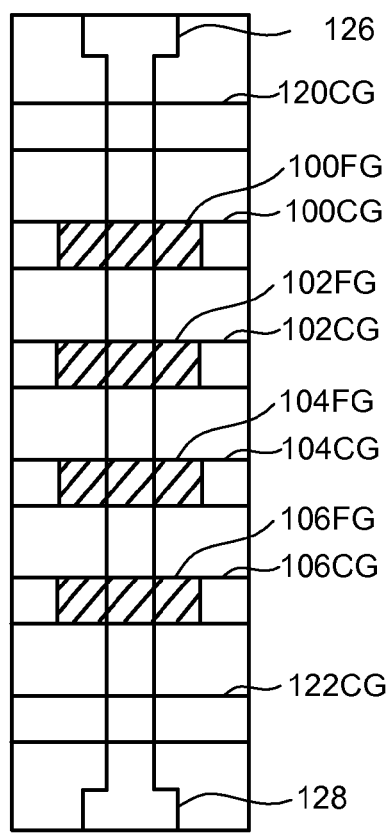
FIG. 1 is a top view of a NAND string.
Figure 2:
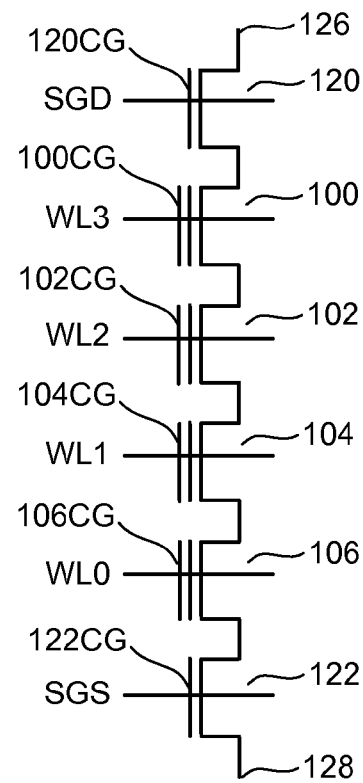
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Each of the channels for the transistors on the NAND string are effected by the bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 128 is connected to select line SGS.

Figure 3:
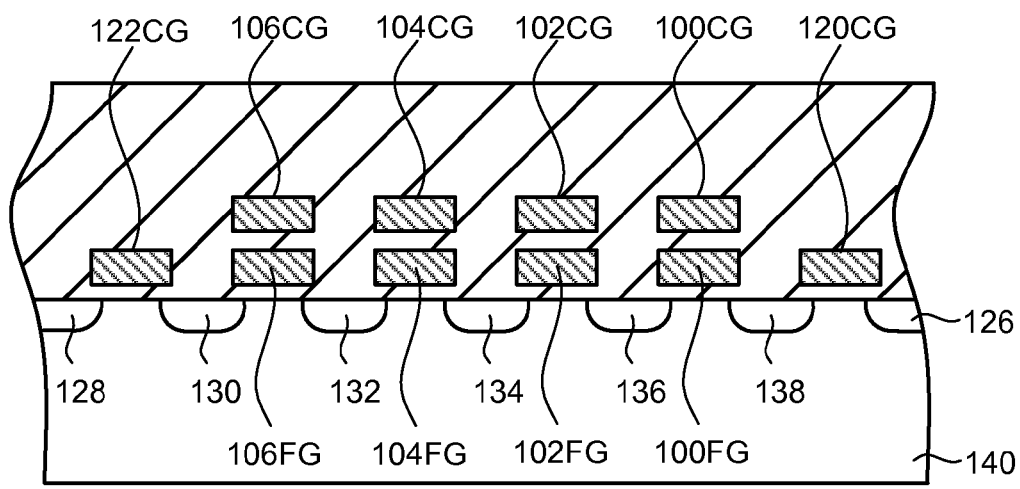
FIG. 3 is a cross sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104, 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor of 106, N+ doped layer 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple states, for example, thereby storing multiple bits of digital data. In the case of storing multiple states of data, the range of possible threshold voltages is divided into the number of states. For example, if four states are used, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528 and U.S. Pat. application Ser. No. 09/893,277 (Publication No. US2003/0002348). Other types of non-volatile memory can also be used with the present invention.

Figure 4:
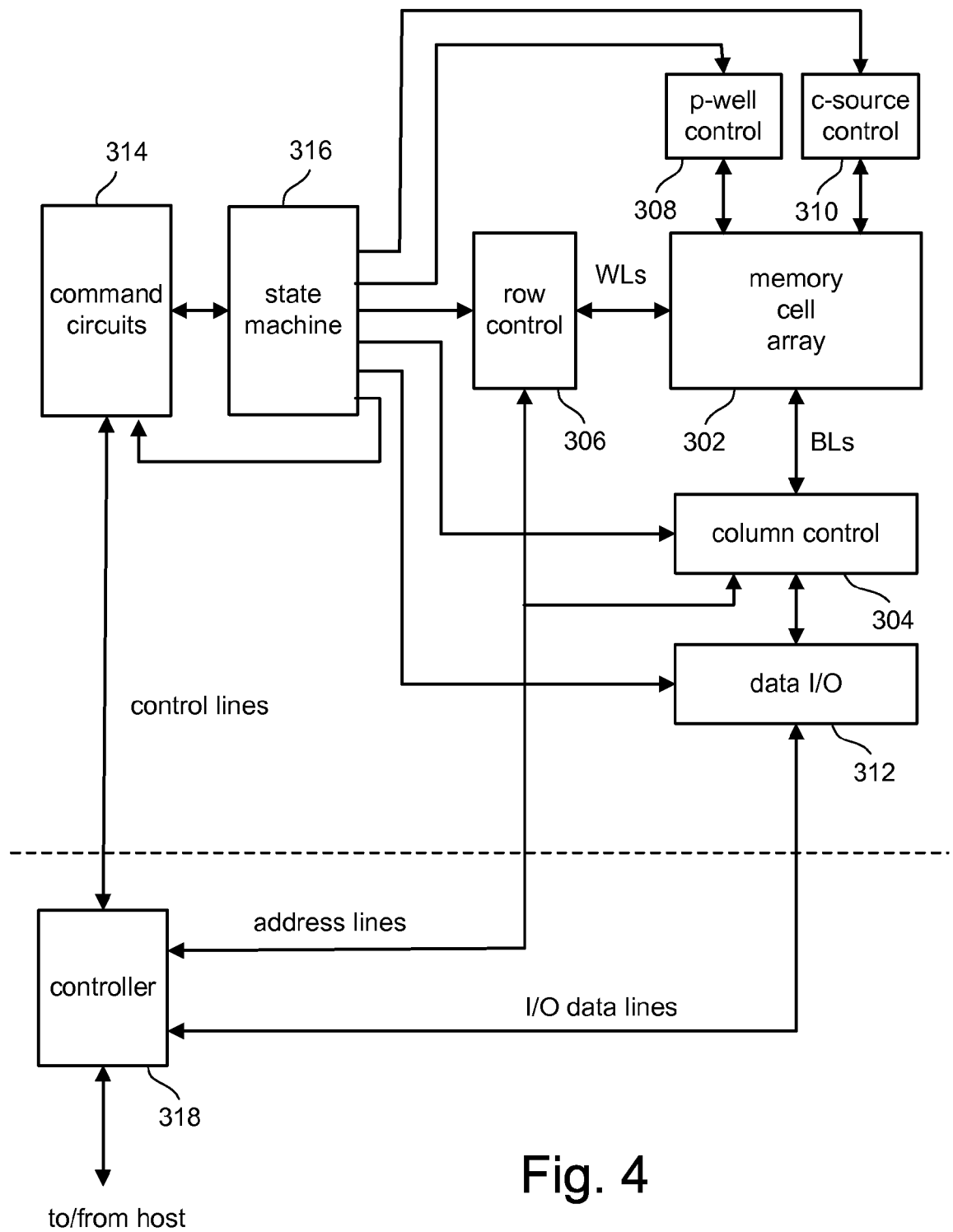
FIG. 4 is a block diagram of one embodiment of a non-volatile memory system in which the various aspects of the present invention are implemented.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 5) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller or control function being embedded in the host). Thus, the controller can be embedded in the host or included within a removable memory system.

In some implementations, some of the components of FIG. 4 can be combined. In various designs, one or more of the components of FIG. 4, other than memory cell array 302, can be thought of as a control circuit.

Figure 5:
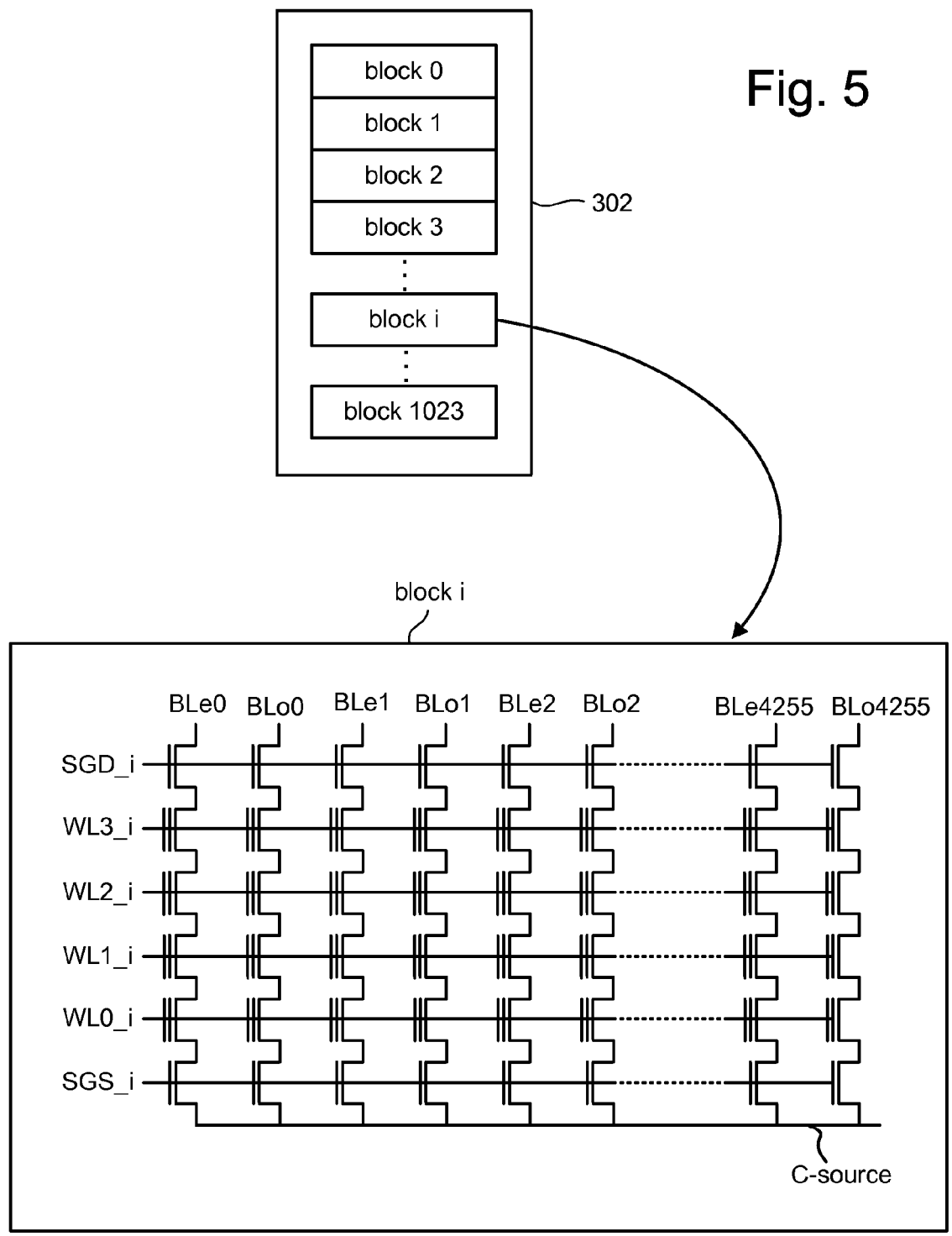
FIG. 5 illustrates an example of an organization of a memory array.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. Other sized blocks and pages can also be used with the present invention. Additionally, architectures other than that of FIGS. 4 and 5 can also be used to implement the present invention.

Memory cells are erased in one embodiment by raising the p-well to an erase voltage (e.g. 20 volts) and grounding the word lines of a selected block while the source and bit lines are floating. Due to capacitive coupling, the unselected word lines, bit lines, select lines, and c-source are also raised to 20V. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell becomes negative. Erasing can be performed on the entire memory array, separate blocks, or another unit of cells.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g. WL2) is connected to a reference voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0v. In a verify operation for a two level memory cell, the selected word line WL2 is connected to 2.4v, for example, so that as the programming progresses it is verified whether the threshold voltage has reached at least 2.4v. The source and p-well are at zero volts during verify. The selected bit lines (BLe) are pre-charged to a level of, for example, 0.7v. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line.

The erase, read and verify operations described above are performed according to techniques known in the art. Thus, many of the details explained can be varied by one skilled in the art. Other read and verify techniques known in the art can also be used.

Figure 6:
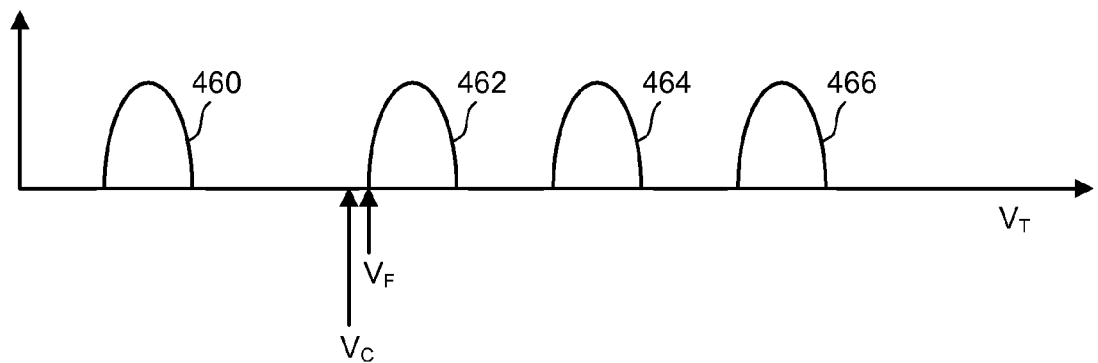
FIG. 6 shows threshold voltage distributions for a multi-state non-volatile memory device.

FIG. 6 illustrates threshold voltage distributions for memory cells storing two bits of data (e.g., four data states). In one embodiment, distribution 460 represents a distribution of threshold voltages of cells that are in the erased state (e.g., storing "11"), having negative threshold voltage levels. Distribution 462 represents a distribution of threshold voltages of cells that are storing "10." Distribution 464 represents a distribution of threshold voltages of memory cells storing "00." Distribution 466 represents a distribution of threshold voltages of cells that are storing "01." In other embodiments, each of the distributions can correspond to different data states than described above. In some implementations, these data values (e.g. logical states) are assigned to the threshold ranges using a gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, the present invention can work with memory cells that store more than two bits of data.

In one implementation, a memory cell in the erased state (e.g., distribution 460) can be programmed to any of the program states (distributions 462, 464 or 466). In another embodiment, memory cells in the erased state are programmed according to a two-step methodology. In this two-step methodology, each of the bits stored in a data state correspond to different logical pages. That is, each bit stored in a memory cell has a different logical page address, pertaining to a lower logical page and an upper logical page. For example, in state "10," the "0" is stored for the lower logical page and the "1" is stored for the upper logical page. In a first programming step, the cell's threshold voltage level is set according to the bit to be programmed into the lower logical page. If that bit is a logic "1," the threshold voltage is not changed since it is in the appropriate state (e.g. distribution 460) as a result of having been earlier erased. However, if the bit is to be programmed to a logic "0," the threshold level of the cell is increased to be within the threshold voltage distribution 462.

In the second programming step, the memory cell's threshold voltage level is set according to the bit being programmed into the upper logical page. If the upper logical page bit is to be logic "1," then no further programming occurs since the cell is in one of the states corresponding to the threshold voltage distribution 460 or 462, both of which carry an upper page bit of "1." If the upper logical page bit is to be logic "0" and the first step resulted in the cell remaining in the erased state corresponding to threshold 460, then the second step of the programming process includes raising the threshold voltage to be within threshold distribution 466. If the upper logical page bit is to be logic "0" and the cell had been programmed into the state corresponding to threshold distribution 462 as a result of the first programming step, then the second step of the programming process includes raising the threshold voltage to be within threshold voltage distribution 464. The two step process is just one example of a methodology for programming multi-state memory. Many other methodologies, including a one step process or more than two steps can be used. Although FIG. 6 shows four states (two bits), the present invention can also be used with other multi-state structures including those that include eight states, sixteen states, thirty-two states, and others.

In one embodiment, memory cells that use an erased state and only one programmed state would only use two threshold voltage distributions. For example, threshold voltage distribution 460 could be used to represent the erased state and threshold voltage distribution 462 could be used to represent the programmed state. Other state assignments can also be used with the present invention.

Figure 7:
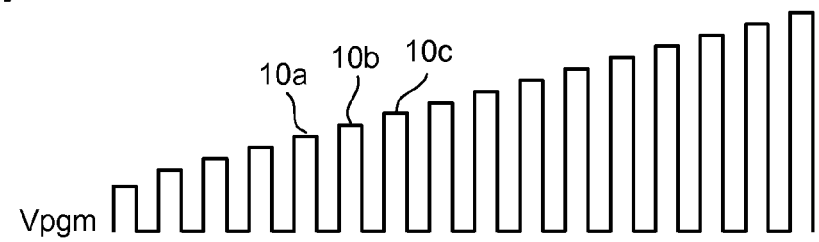
FIG. 7 depicts a programming voltage signal, which includes a series of programming pulses with magnitudes increasing over time.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised to one of the threshold voltage distribution described above. Typically, the program voltage applied to the control gate is applied as a series of pulses. In one embodiment, the magnitude of the pulses is increased with each successive pulse by a predetermined step size (e.g. 0.4v, 0.2v, or others). FIG. 7 shows a program voltage signal Vpgm applied to the control gates of flash memory cells.

Figure 8:
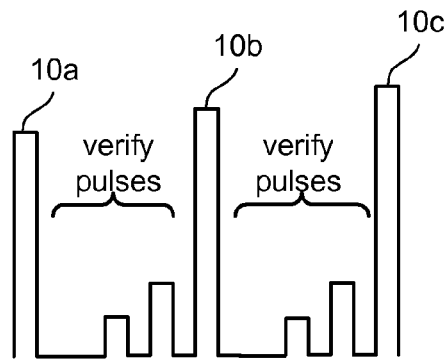
FIG. 8 depicts three of the programming pulses from the signal of FIG. 7, and the verification pulses between the programming pulses.

In the periods between the program pulses, verify operations are carried out. That is, the programming level of each cell of a group of cells being programmed in parallel is read between successive programming pulses to determine whether it is equal to or greater than a verify level to which it is being programmed. For arrays of multi-state flash memory cells, the memory cells will perform a verification step for each state to determine which state the memory cell is within. For example, a multi-state memory cell capable of storing data in four states may need to perform verify operations for three compare points. FIG. 8 shows three programming pulses 10a, 10b and 10c (each of which are also depicted in FIG. 7). Between the programming pulses are three verify pulses in order to perform three verify operations. Based on the three verify operations, the system can determine whether or not the threshold compare point of the data state associated with each memory cell of the population of memory cells being concurrently programmed has been reached. Note that one of the verify pulses is at 0 volts.

The present invention relates to technology for reducing the overall time needed to program a given amount of data into a non-volatile memory. One embodiment provides for faster overall programming by concurrently programming multiple pages within a single erasable block, thereby increasing write performance without increasing erase block size. For example, multiple memory cells on the same NAND string can be programmed concurrently. In one implementation, various data conditional channel programming potentials are established in spaced apart memory cells within the NAND string, using intervening memory cells (referred to as boundary memory cells) as isolation there-between. Setting up the various internal potentials can be accomplished by a sequential data load process followed by an isolation (voltage trapping) operation. The data load process, to be explained in more detail below, essentially includes causing channels of addressed memory cells selected for programming to be at voltage potentials appropriate for programming and causing channels of memory cells not selected for programming to be at a voltage potential appropriate for inhibiting programming. Once this "data loading" sequence is completed, all the selected control gates (e.g., the control gates for the addressed memory cells to be data conditionally programmed) are ramped to their programming voltage (e.g., a pulse that can have a magnitude up to ~20v, in one embodiment) to effect the data conditional programming.

The magnitude of this programming and resulting threshold voltage shift depends both on the channel potential and on the relative storage strength (i.e. relative capacitance) of the underlying channel and source/drain reservoir. The underlying channel and source/drain reservoir is used to hold the boosting voltage for memory cells to be inhibited. The underlying channel and source/drain reservoir is also used to absorb the voltage applied to word lines so that the channel remains at or near 0 volts (or other target potential) for memory cells being programmed. If the underlying channel and source/drain reservoir is too small (e.g. limited cathode programming charge scenario), then very little programming will occur, requiring many repetitions to get useful programming. Use of substantially higher voltages may help a bit, but is unattractive, putting more burden on the process and circuitry to support such higher voltage, increasing vulnerability to programming disturbs as well as degrading overall reliability.

If one cell's channel and neighboring source/drains relative capacitance are not adequate to support this reservoir cathode function, then more storage elements will need to be strung together to hold the appropriate voltage levels. For example, this can be accomplished by setting up every fourth memory cell (i.e. row) for concurrent programming, with one of the intervening memory cells serving as isolation and the other two intervening memory cells providing additional cathode reservoir capacitance for data conditional programming. In the case of a sixteen element NAND string this would include four pages being concurrently programmed, allowing programming of the set of sixteen pages (in a binary flash device) in four data write operations. If the NAND string length is doubled to thirty two, then eight pages can be concurrently programmed, approximately further doubling the effective programming speed. However, the erase block size also doubles, increasing the garbage collection area in the same proportion. Furthermore, the actual write speed increase depends on the proportion of time required for verify, which does not change since separate verify operations must be performed on each of the concurrently programmed pages.

To increase the relative capacitance in order to better support this reservoir cathode function, every eight or every sixteenth memory cell can be concurrently programmed, with one of the intervening memory cells serving as isolation and the other intervening memory cells providing additional cathode reservoir capacitance for data conditional programming. Note that the number of memory cells programmed concurrently depends on the number of intervening memory cells providing additional cathode reservoir capacitance. The number of intervening memory cells required in order to provide the necessary additional cathode reservoir capacitance depends on the device physics of the transistors and neighboring source/drain junctions. What is important is that there are enough intervening memory cells to provide the necessary additional cathode reservoir capacitance.

Figure 9:
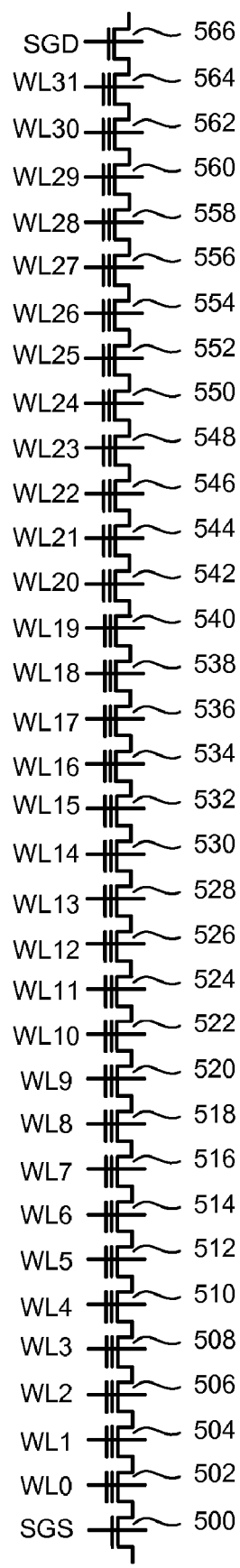
FIG. 9 depicts a NAND string.

FIG. 9 depicts a NAND string with thirty two memory cells: 502-564. The NAND string also includes a source side select gate 500 and a drain side select gate 566. Connected to the control gate for the source side select gate 500 is a select signal SGS. Connected to the control gate for the drain side select gate 566 is a select signal SGD. Each memory cell of FIG. 9 is connected to a word line. Memory cell 502 is connected to word line WL0. Memory cell 504 is connected to word line WL1. Memory cell 506 is connected to word line WL2. Memory cell 508 is connected to word line WL3. Memory cell 510 is connected to word line WL4. Memory cell 512 is connected to word line WL5. Memory cell 514 is connected to word line WL6. Memory cell 516 is connected to word line WL7. Memory cell 518 is connected to word line WL8. Memory cell 520 is connected to word line WL9. Memory cell 522 is connected to word line WL10. Memory cell 524 is connected to word line WL11. Memory cell 526 is connected to word line WL12. Memory cell 528 is connected to word line WL13. Memory cell 530 is connected to word line WL14. Memory cell 532 is connected to word line WL15. Memory cell 534 is connected to word line WL16. Memory cell 536 is connected to word line WL17. Memory cell 538 is connected to word line WL18. Memory cell 540 is connected to word line WL19. Memory cell 542 is connected to word line WL20. Memory cell 544 is connected to word line WL21. Memory cell 546 is connected to word line WL22. Memory cell 548 is connected to word line WL23. Memory cell 550 is connected to word line WL24. Memory cell 552 is connected to word line WL25. Memory cell 554 is connected to word line WL26. Memory cell 556 is connected to word line WL27. Memory cell 558 is connected to word line WL28. Memory cell 560 is connected to word line WL29. Memory cell 562 is connected to word line WL30. Memory cell 564 is connected to word line WL31. The NAND string of FIG. 9 will be used to explain the present invention. However, it is noted that the present invention may be used with other types of non-volatile storage.

Assume, for purposes of example, an embodiment where two memory cells on the NAND string of FIG. 9 are programmed concurrently. In one implementation, the NAND string is divided into two regions. For example, assume a bottom region includes memory cells 502-532 and a top region includes memory cells 534-564. During a programming process, one memory cell from the top region will be programmed concurrently with one memory cell from the bottom region. There are many suitable methods for choosing which memory cell from the bottom region is paired with which memory cell from the top region. In one example, the memory cell from the top region is 16 memory cells (total cells on NAND string divided by number of groups) away from the memory cell of the bottom regions. This means that memory cell 518 would be concurrently programmed with memory cell 550, memory cell 520 would be concurrently programmed with memory cell 552, etc.

FIG. 10 is a flow chart describing one embodiment of a process for programming using the above described technology. In step 602, the portion of the memory to be programmed is selected. In one implementation, this can be one or more write units appropriate to the memory structure. One example of a write unit is referred to as a page. In other embodiments, other units and/or structures can also be used. In step 604, a pre-programming process is sometimes used wherein the addressed memory cells are given non-data dependent programming to level out storage element wear and provide a more uniform starting point for the subsequent erase. In step 606, an erase process is performed, as appropriate for the type of storage element being used. One example of a suitable smart erase process is described in U.S. Pat. No. 5,095,344, incorporated herein by reference in its entirety. Step 608 includes an optional soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

In step 610, the program voltage (Vpgm) is set to an initial value. For example, in some embodiments, the waveform of FIG. 7 is used and step 610 includes setting the initial pulse. Also, in step 610, a program counter (PC) is initialized to zero.

In step 618, the various programming conditions are established. In the example described above which includes two groups on a 32 cell NAND chain, there are two conditions set up: a first programming condition for the bottom group and a second programming condition for the top group. If there are more than two groups (e.g., 4, 5, 6, etc.), then (in one embodiment) a programming condition is set up for each group. In one implementation, the programming conditions are set up sequentially, starting with the group closest to the source line. Although the various programming conditions may be established at different times, they all will persist for at least a common portion of time prior to the programming pulse being applied. For example, after step 618 is completed, the programming conditions for all of the groups will be set.

In step 620, program pulses are concurrently applied. If two memory cells are being programmed concurrently, then two program pulses are applied: one program pulse is applied to the first memory cell being programmed and a second program pulse is concurrently applied to the second memory cell being programmed. If four memory cells are being programmed concurrently, then four program pulses are applied.

In step 622, a verification process is performed to the memory cells being concurrently programmed. During the verification process of step 622, if a memory cell being programmed has attained its target threshold voltage condition, then it is inhibited from further programming during the remained of the data programming session. Two memory cells that are being programmed concurrently may reach their target threshold voltage conditions at different times causing the memory cells to being inhibited at different times. As such, there may be a time when one of the memory cells is being programmed while the other memory cell is inhibited. Although such a situation can occur, the programming processes for the memory cells still overlap in time.

In step 624, it is determined whether each of the memory cells have verified that their threshold voltages are at the target threshold voltage condition for that memory cell. If so, the programming process is completed successfully (status=pass) in step 626 breaking out of the programming loop of FIG. 10. If all of the memory cells are not all verified, then it is determined whether the program counter (PC) is less than 20. If the program counter (PC) is not less than 20 (step 628), then the program process indicates a status of "fail," again braking out of the program loop of FIG. 10. (step 630). If the program counter (PC) is less than 20, then the program counter (PC) is incremented by 1 and the program voltage is stepped up to the next pulse in step 632. Subsequent to step 632, the process loops back to step 620 and the set of programming conditions is applied to the memory cells.

FIG. 11 is a flow chart describing more details of one embodiment of the process for establishing program conditions (step 618 of FIG. 10). The steps of FIG. 11 implement an example that divides a NAND string into two groups, as discussed above. For ease of description, assume that memory cells 518 and 550 of FIG. 9 are to be programmed concurrently. Note that although much of the examples pertain to the NAND string of FIG. 9, in many implementations there will be many NAND strings being programmed simultaneously (e.g., as described above all even or all odd bit lines for a block may be programmed simultaneously).

In step 700, the drain side select gate 556 is turned on. For example, Vdd can be applied to the signal SGD. In step 702, data for memory cells in the bottom group is applied to the bit lines. For example, bit lines connected to NAND strings of bottom group memory cells that are not to receive programming may receive an inhibit voltage, such as Vdd (e.g. ~2.5 volts), and bit lines connected to NAND strings that are to receive programming may receive a voltage that enables programming (e.g., ~0 volts). In other embodiments, the bit line may receive an intermediate voltage (e.g., 1.5v or other values) that allows partial or reduced speed programming. For example, the intermediate voltage may be used to retard programming as part of a coarse/fine programming methodology. More information about coarse/fine programming methodologies can be found in the following patent documents that are incorporated herein by reference in their entirety: U.S. patent application Ser. No. 10/766,217, "Efficient Verification for Coarse/Fine Programming of Non-Volatile Memory" filed Jan. 27, 2004; U.S. patent application Ser. No. 10/051,372, "Non-Volatile Semiconductor Memory Device Adapted to Store A Multi-Valued Data in a Single Memory Cell," filed Jan. 22, 2002; U.S. Pat. Nos. 6,301,161; 5,712, 815; 5,220,531; and 5,761,222.

The data applied to the bit lines in step 702 is for the memory cell in the bottom group. For example, the data is for memory cell 518.

In step 704, one or more boosting voltages are applied to the word lines connected to the NAND string. Those NAND strings receiving 0 volts at the bit line will dissipate the boosting voltage so that the channel region(s) for those NAND strings (including the bottom group) will be at or near 0 volts. Those NAND strings receiving 2.5 volts at the bit line will have channel regions boosted, for example, to approximately 7.5 volts in the case of a 9 volt boosting voltage applied to the word lines.

Consider that a transistor in a NAND string will turn on if VG−VS>VTH, where VG is the voltage applied to the gate, VS is the voltage at the source and VTH is threshold voltage of the transistor. The NAND transistor is symmetrical in that either side could be the source or the drain. The side with the lower voltage is typically referred to as the source. Thus, as voltages change, which side is the source and which side is the drain may also change. If VG is less than VTH than the transistor is cut off (no conduction between source and drain). If both VS and VD are increased relative to a given VG, so that VG−VS<VTH (remember that VD>VS), then the device is also cut-off.

To inhibit a NAND string from programming, the to be inhibited bit lines (termed unselected bit lines) are raised to Vdd (e.g., ~2.5 volts). In one embodiment, the control gate of the drain side select gate is also at Vdd, causing the select gate to conduct. The NAND strings on the unselected bit lines are then boosted by the boosting voltages applied to the word lines, which raises the voltage in the NAND string. When the voltage in the NAND string reaches VG−VTH (of the select gate), then the select gate will cut-off, which isolates the NAND string from the bit line so that the voltage on the NAND string will not be dissipated into the bit line. The voltage on the NAND string will then continue to increase so that it is higher then VG, but because the bit line potential is greater than VG−VTH, the select gate will remain cut-off and the voltage in the NAND string will continue to increase in concert with the increasing boosting voltage, for example, to about 7.5 volts. When the voltage in the channel is at this boosted potential (e.g., 7.5 volts), the differential across the tunnel dielectric is not sufficient to allow for tunneling of electrons into the floating gate during the time of programming which could cause data state failure.

In step 706, the boundary cells between the bottom group and the top group will be cut off for each for the NAND strings. In one embodiment, the boundary cells are the memory cells that are at the borders between the groups. In the above example, the boundary cell between the bottom group and the top group could be memory cell 532 or memory cell 534. In another embodiment, the boundary cell can be the memory cell that is midway between the two memory cells being programmed. In other embodiments, the boundary cell could be some other memory cell between the two memory cells being programmed. In one implementation, the boundary cell is cut-off by apply a voltage to its control gate that is less than the threshold voltage for that boundary cell. In one example, it may be possible for an erased memory cell to have a negative threshold voltage; therefore, negative voltage (e.g., −4 volts) is applied to the control gate of the boundary cells in order to insure cut-off the boundary cells.

Note that in some embodiments, the boundary cells are memory cells that also may need to be programmed. When it is time to program a memory cell that is a boundary cell, a different memory cell will become the boundary cell. For example, an adjacent memory cell or memory cell two or more away in the NAND string, and separating the memory cells being programmed, can become the new boundary cell.

In step 708, the word lines for the top group are reset (e.g., to 0 volts). In step 710, data is applied to the bit lines for the top group. In step 712, one or more boosting voltages are applied to the word lines for the top group, while leaving the voltages already applied to those of the bottom group unchanged. Those NAND strings receiving 0 volts at the bit line in step 710 will dissipate the boosting voltage applied to the top group in step 712 so that the channel region(s) are at or near 0 volts. Those NAND strings receiving 2.5 volts at the bit line in step 710 will have channels (for the top group) boosted, for example, to approximately 7.5 volts for a 9 volt boosting voltage applied to the word lines. In step 714, the drain side select gate is optionally cut-off (e.g., by lowering its control gate voltage to 0 volts).

Figure 12:
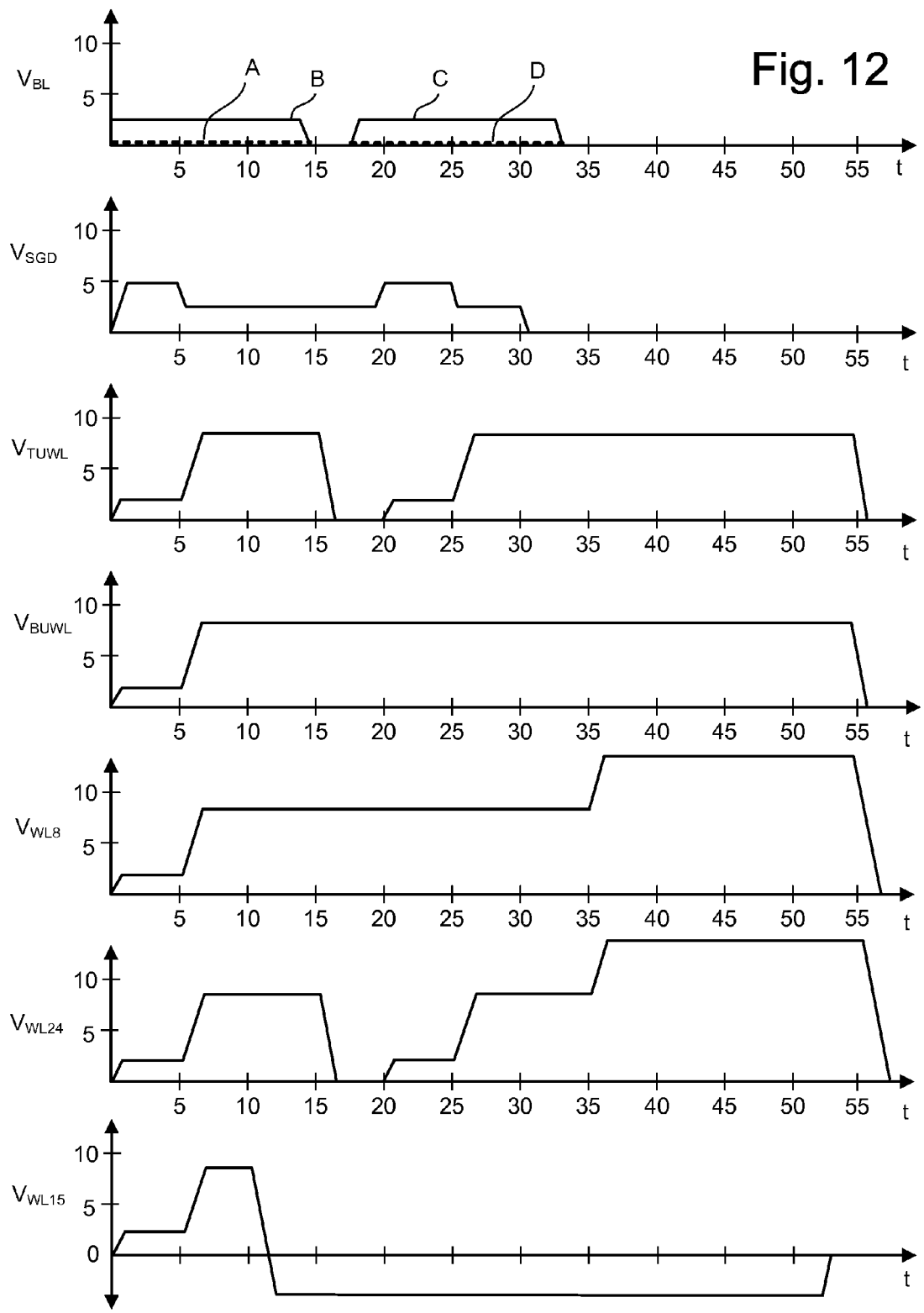
FIG. 12 is a timing diagram describing the behavior of various signals during the program process.

FIG. 12 is a timing diagram that explains the behavior of seven signals (VBL, VSGD, VTUWL, VBUWL, VWL8, VWL24 and VWL15) operating according to he process of FIG. 11. The signals of FIG. 12 implement both steps 618 and 620 of FIG. 10. Note that FIG. 12 plots voltage versus time for various signals. To improve the explanation, numbers are assigned to the time units. In one example implementation, the time units may correspond to μsec. However, the invention is in no way limited to any particular timing and the time units are chosen for example purposes only.

The graph for the bit line voltage VBL shows four possible bit line voltage signals: A, B, C and D. Signal A, at approximately 0 volts until 14 time units, is applied to a bit line to allow a memory cell of the bottom group to be programmed. Signal B, at approximately 2.5 volts until 14 time units, is applied to a bit line to inhibit a memory cell of the bottom group. Signal C, at approximately 2.5 volts starting from 18 time units until optionally 33 time units, is applied to a bit line to inhibit a memory cell of the top group. Signal D, at approximately 0 volts starting from 18 time units and optionally held there until 33 time units, is applied to a bit line to allow a memory cell of the top group to be programmed. These optional conditions are the optional waveform considerations of VSGD described below. Either signal A or signal B will be asserted as part of step 702 of FIG. 11. Either signal C or signal D will be asserted as part of step 710. Thus, when programming, there are four possible forms of bit line voltage VBL: (1) signal A followed by signal C for programming the memory cell in the bottom group while inhibiting the memory cell in the top group, (2) signal A followed by signal D for programming the memory cell in the bottom group and programming the memory cell in the top group, (3) signal B followed by signal C for inhibiting the memory cell in the bottom group and inhibiting the memory cell in the top group, and (4) signal B followed by signal D for inhibiting the memory cell in the bottom group and programming the memory cell in the top group. Which of the four waveforms is applied to the bit line depends on the data to be stored and the current threshold voltage of the memory cells.

The voltage $V_{SGD}$ applied to the drain side select gate is raised to approximately 5 volts at time 0, as part of step 700. At time unit 5, $V_{SGD}$ is lowered to 2.5 volts. At time 20 it is raised to 5 volts, and then subsequently lowered to 2.5 volts at time 25. At time 30, $V_{SGD}$ is optionally lowered to 0 volts as per step 714 of FIG. 11. Note that optionally bringing $V_{SGD}$ to 0v at time unit 30 frees up the bit lines, allowing $V_{BL}$ to change so that the bit lines can be used for other purposes. Alternatively, $V_{SGD}$ can be left at the selected voltage level of 2.5 volts for the duration of that programming step (e.g., until time 58) and shut-off thereafter. In that case, the bit line voltage conditions $V_{BL}$ of signals C and D should also be maintained for the duration (e.g., to approximately time 58). The period when $V_{SGD}$ is at 5 volts is used to pre-charge the bit line before each boosting phase.

The signal $V_{TUWL}$ is the voltage on the unselected word lines associated with the memory cells in the top group (Top Unselected Word Lines). The signal $V_{BUWL}$ is the voltage on the unselected word lines connected to the memory cells in the bottom group (Bottom Unselected Word Lines). The signal VWL8 is the voltage on the selected word line WL8 connected to the memory cell 518 of FIG. 9 selected for programming in the bottom group. The signal VWL24 is the voltage on the selected word line WL24 connected to the memory cell 550 selected for programming in the top group. The signal VWL15 is the voltage on the word line WL15, connected to the boundary memory cell 532. The signals VTUWL, VBUWL, VWL8, VWL24 and VWL15 are raised to approximately 1.5 volts during the initial period when VSGD is at 5 volts in order to pre-charge the bit line/NAND string. At time 5, signals VTUWL, VBUWL, VWL8, VWL24 and VWL15 are raised to approximately 9.5 volts (could also be 9 volts or other levels), as per step 704 of FIG. 11, to provide a boosting voltage. Those NAND strings receiving signal B on the bit line will be boosted and those NAND strings receiving signal A on the bit line will remain at or near 0 volts. At time 10, the boundary cell will be cut off (as per step 706), by lowering VWL15 to approximately −4 volts. The word lines for the top group are reset in step 708 by lowering signals VTUWL and VWL24 to 0 volts at time 15. VBUWL remains at 9.5 volts until time 55. VWL8 remains at 9.5 volts until the start of the programming, at time 35.

At this point a first programming condition has been established and is maintained for the bottom group of memory cells. In one embodiment, the channel of bottom group transistors will be at or near 0 volts for programming or at or near 7.5 volts for inhibiting programming.

Either signal C or signal D will be asserted on VBL as part of step 710. The signals VTUWL and VWL24 are raised to approximately 1.5v at time 20 to allow NAND string pre-charging, and to approximately 9.5 volts at time 25 to provide boosting for the top group in step 712, and remain at 9.5 volts until time 55. The control gate voltage VSGD for the drain side select transistor is optionally lowered to 0 volts at time 30 in order to cutoff the select transistor, as per step 714. At this point a second programming condition has established and is maintained for the top group of memory cells. In one embodiment, the channel of top group transistors will be at or near 0 volts for programming or at or near 7.5 volts for inhibiting programming. Note that the first program condition and the second programming condition both persist at this time. The pre-charge condition associated with raising VSGD to 5v at time intervals 0 to 5 and 20 to 25, described in this example waveform, is optional. In other embodiments, no such pre-charge operation is used and VSGD is maintained at the 2.5v level during those time intervals.

At time 35, the program pulses are applied to VWL8 and VWL24. In one embodiment, the magnitude of the pulses can vary between 12 and 20 volts. Thus, both VWL8 and VWL24 are raised at time 35 to the magnitude of the desired program pulse voltage and both memory cells 518 and 550 are concurrently programmed as dictated by the just described bit line related data programming setup. The program pulse lasts until time 55, at which time $V_{TUWL}$, $V_{BUWL}$, $V_{WL8}$, $V_{WL24}$ and $V_{WL15}$ (and optionally $V_{BL}$ and $V_{SGD}$) are all brought to 0 volts.

Figure 13:
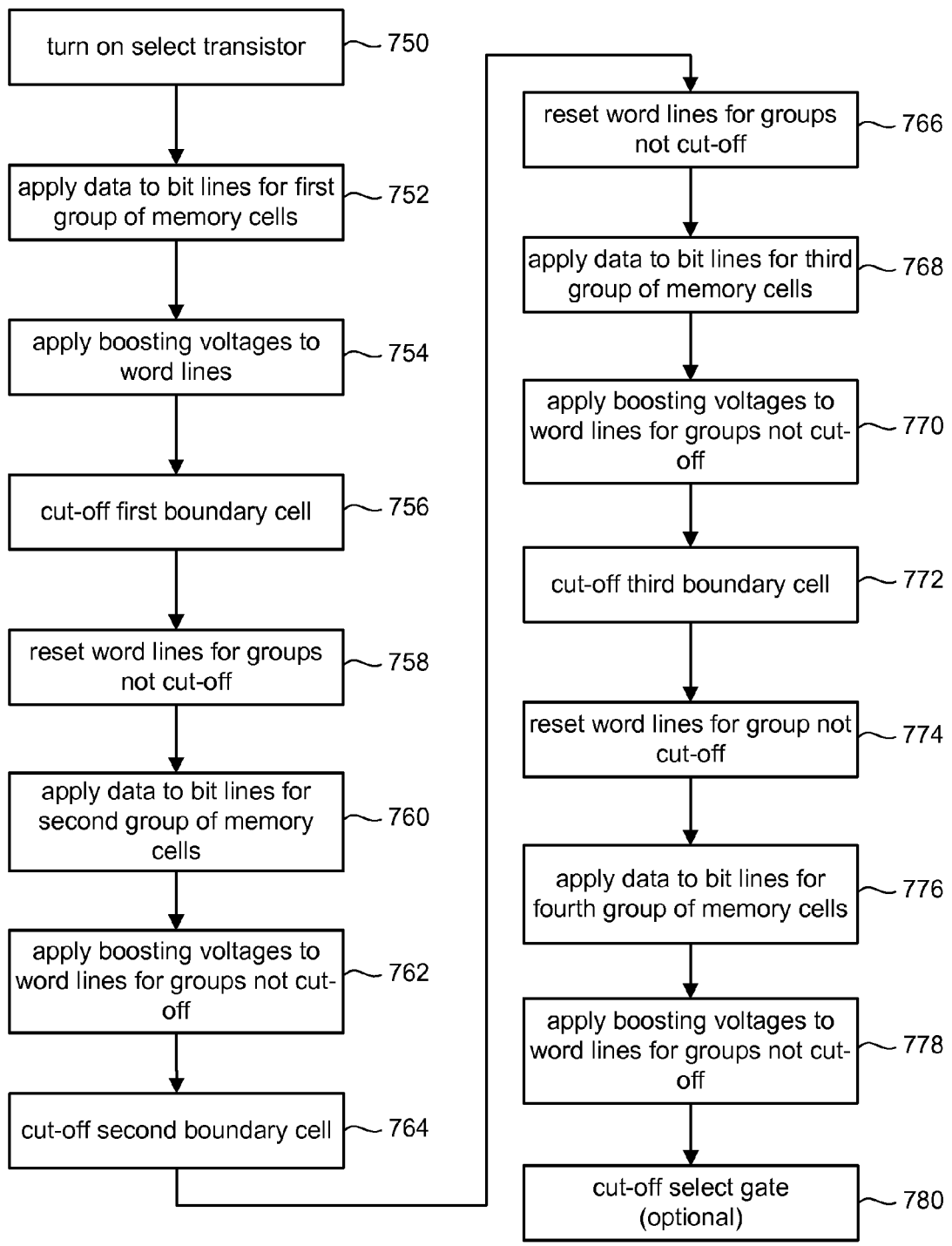
FIG. 13 is a flow chart describing one embodiment of a process for establishing program conditions.

FIG. 13 is a flow chart describing more details of another embodiment of the process for establishing program conditions (step 618 of FIG. 10). The steps of FIG. 13 implement an example that divides a NAND string into four groups so that four memory cells on a common NAND string are concurrently programmed. In one such implementation using the NAND string of FIG. 9, the first group corresponds to memory cells 502-516, the second group corresponds to memory cells 518-532, the third group corresponds to memory cells 534-548 and the fourth group corresponds to memory cells 550-564. One example set of the boundary cells includes memory cells 516, 532 and 548. Other memory cells can also serve as boundary cells.

In step 750 of FIG. 13, the drain side select gate 556 is turned on. For example, Vdd can be applied to the signal SGD. In step 702, data is applied to the bit lines. The data applied to the bit lines in step 752 is for the memory cell in the first group that is being programmed. For example, the data is for memory cell 508. In step 754, one or more boosting voltages are applied to the word lines connected to the NAND string. In step 756, the boundary cells between the first group and the second group will be cut off. In step 758, the word lines for the groups not cut off (e.g., groups 2-4) are reset. Group one word lines remain at the boosting voltage. In step 760, data for the second group is applied to the bit lines. In step 762, one or more boosting voltages are applied to the word lines for the groups not cut-off (groups 2-4). In step 764, the boundary cell between the second group and the third group is cut-off.

In step 766, the word lines for the groups not cut-ff (e.g., groups 3-4) are reset. Word lines for group one and two remain at the boosting voltage. In step 768, data for the third group is applied to the bit lines. In step 770, one or more boosting voltages are applied to the word lines for the groups not cut-off (groups 3-4). In step 772, the boundary cell between the third group and the fourth group is cut-off.

In step 774, the word lines for the groups not cut-ff (e.g., group 4) are reset. Group one, two and three word lines remain at the boosting voltage. In step 776, data for the fourth group is applied to the bit lines. In step 778, one or more boosting voltages are applied to the word lines for the group not cut-off (group 4). In step 780, the drain side select gate is optionally cut-off. The considerations for this optional select gate cutoff are analogous to those described earlier for the two group case. Note that, in one embodiment, the process of FIG. 13 is performed simultaneously for many NAND strings.

The process of FIG. 13 describes the use of four groups so that four memory cells on a NAND string can be simultaneously programmed. The process of FIG. 13 can be adapted to be used with more than four groups so that more than four memory cells on a NAND string can be simultaneously programmed. For example, steps 758-764 (with the iteration of step 760 applying the appropriate data and step 764 cutting-off the appropriate boundary cell) can be repeatedly performed for each additional group.

FIG. 14 is a flow chart describing one embodiment of a process for verifying. In one example implementation, the process of FIG. 14 is performed as part of step 622 of FIG. 10 for a NAND string divided into two groups. Note that although multiple memory cells are programmed simultaneously, in one embodiment the verification process is performed sequentially. In step 820, pass voltages are applied to the unselected word lines in regard to the bottom group. That is the word lines for all of the memory cells, except the memory cell selected for programming in the bottom group, receive a pass voltage. The pass voltage (e.g. 4.5 volts) is designed to make sure that each of the unselected memory cells is sufficiently turned on. In step 822, one or more verify pulses (appropriate to the type of data being programmed) are applied to the word line associated with the memory cell selected for programming in the bottom group. Step 822 may also include pre-charging the bit line, as discussed above. The data is sensed for each of the verify pulses. One verify pulse is used for binary memory storage, and multiple verify pulses (e.g, total number of states −1, as per FIG. 8) are used for multi-state memory storage. In step 824, the system determines whether the memory cell has reached its target threshold voltage condition. If a memory cell has reached its target threshold voltage condition, then that memory cell is locked out from further programming in step 826 (e.g., by raising its bit line voltage to Vdd), thereby terminating programming to that memory cell for the duration of that programming session.

In step 828, pass voltages are applied to the unselected word lines in regard to the top group. That is, the word lines for all of the memory cells, except the memory cell selected for programming in the top group, receives a pass voltage. The pass voltage (e.g. 4.5 volts) is designed to make sure that each of the unselected memory cells are sufficiently turned on. In step 830, one or more verify pulses are applied to the word line associated with the memory cell selected for programming in the top group. Step 830 may also include precharging the bit line, as discussed above. The data is sensed for each of the verify pulses. In step 832, the system determines whether the memory cell has reached its target threshold voltage. If a memory cell has reached its target threshold voltage, then that memory cell is locked out from further programming (e.g., by raising its bit line voltage to Vdd) in step 834 (analogous to step 826). Note that the process of FIG. 14 is performed on multiple NAND strings simultaneously. Furthermore, the process of FIG. 14 can be adapted to be used for more than two groups by repeating step 820-826 for each of the additional groups.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A method for programming non-volatile storage, comprising:

establishing a first write condition for a first non-volatile storage element;

establishing a second write condition for a second non-volatile storage element while said first write condition persists, said first write condition is different than said second write condition so that said first non-volatile storage element programs to a different level than said second non-volatile storage element, said first non-volatile storage element and said second non-volatile storage element are part of a group of non-volatile storage elements associated with a common source/drain control line and a common selection line, said establishing a first write condition includes applying a first value to said common source/drain control line, boosting word lines associated with said group, and cutting off a boundary non-volatile storage element associated with said group, said establishing a second write condition includes applying a second value to said common source/drain control line, and boosting at least a subset of said word lines associated with said common source/drain control line; and writing data to said first non-volatile storage element using said first write condition and said second non-volatile storage element using said second write condition.

2. A method according to claim 1, wherein:
said writing data includes applying a write pulse to said first non-volatile storage element and applying a write pulse to said second non-volatile storage element.

3. A method according to claim 1, wherein:

said first non-volatile storage element and said second non-volatile storage element are NAND flash memory devices on a NAND string;

said common source/drain control line is a bit line connected to said NAND string;

said common selection line is a drain side select gate control line for said NAND string; and said writing data to said first non-volatile storage element overlaps in time with said writing data to said second non-volatile storage element.

4. A non-volatile storage system, comprising:

a group of non-volatile storage elements associated with a common source/drain control line and a common select line, said group includes a first non-volatile storage element and a second non-volatile storage element; and a control circuit, said control circuit establishes a first write condition for said first non-volatile storage element and establishes a separate second write condition for said second non-volatile storage element while said first write condition persists, said control circuit causes writing data to said first non-volatile storage element based on said first write condition and writing data to said second non-volatile storage element based on said second write condition, said establishing of a first write condition includes causing a first value to be applied to said common source/drain control line, causing word lines associated with said group to receive one or more boosting voltages, and causing a boundary non-volatile storage element associated with said group to cut-off, said establishing of a second write condition includes causing a second value to be applied to said common source/drain control line, and causing at least a subset of said word lines associated with said group to receive boosting voltage.

5. An apparatus according to claim 4, wherein:
said writing data to said first non-volatile storage element includes applying a write pulse to said first non-volatile storage element and said writing data to said second non-volatile storage element includes applying a write pulse to said second non-volatile storage element.

6. An apparatus according to claim 4, wherein:

said first non-volatile storage element and said second non-volatile storage element are NAND flash memory devices on a NAND string;

said common source/drain control line is a bit line connected to said NAND string;

said common selection line is a drain side select gate control line for said NAND string; and said writing data to said first non-volatile storage element overlaps in time with said writing data to said second non-volatile storage element.

7. A method for programming non-volatile storage, comprising:

establishing a first write condition for a first non-volatile storage element on a NAND string;

establishing a second write condition for a second non-volatile storage element on said NAND string while said first write condition persists, said first write condition is separate from said second write condition; and writing data to said first non-volatile storage element using said first write condition and said second non-volatile storage element using said second write condition, said establishing a first write condition includes applying a first value to a bit line that is shared by said first non-volatile storage element and said second non-volatile storage element, boosting word lines associated with said bit line, and cutting off a boundary non-volatile storage element associated with said NAND string, said establishing a second write condition includes applying a second value to said bit line, and boosting at least a subset of said word lines associated with said bit line.

8. A method according to claim 7, wherein:
said writing data includes applying a write pulse to said first non-volatile storage element and applying a write pulse to said second non-volatile storage element.

9. A non-volatile storage system, comprising:
a plurality of NAND strings of non-volatile storage elements; and
a control circuit in communication with said NAND strings, said control circuit establishes multiple write conditions on each of said NAND strings, each of said write conditions is associated with a different non-volatile storage element of said non-volatile storage elements, wherein to establish multiple write conditions on a first NAND string of said NAND strings said control circuit establishes a first write condition on said first NAND string and a second write condition on said first NAND string, wherein to establish said first write condition said control circuit causes a first value to be applied to a common bit line on said first NAND string, causes one or more word lines associated with said first NAND string to receive one or more boosting voltages, and causes a boundary element on said first NAND string to cut-off, wherein to establish said second write condition said control circuit causes a second value to be applied to said bit line, and causes one or more word lines associated with said first NAND string to receive one or more boosting voltages; and
said control circuit causes concurrent writing of data to multiple non-volatile storage elements on each of said NAND strings based on said write conditions.

10. A non-volatile storage system according to claim 9, wherein said non-volatile storage elements includes a first non-volatile storage element having associated therewith the first write condition, and wherein data that is written to the first non-volatile storage element has a value that is dependent on said first write condition.

11. A non-volatile storage system according to claim 9, wherein to cause said concurrent writing of data to said multiple storage elements on each NAND string said control circuit applies a first write pulse to a first non-volatile storage element on each NAND string and said control circuit applies a second write pulse to a second non-volatile storage element on each NAND string, said control circuit applies first write pulse and said second write pulse concurrently.

12. A non-volatile storage system according to claim 9, wherein said control circuit includes a controller, a state machine, decoders, and sense amplifiers.

13. A non-volatile storage system according to claim 4, wherein said control circuit includes a controller, a state machine, decoders, and sense amplifiers.

* * * * *